United States Patent
Lehr

(10) Patent No.: US 9,450,042 B2
(45) Date of Patent: Sep. 20, 2016

(54) INTEGRATED CIRCUITS WITH METAL-INSULATOR-METAL (MIM) CAPACITORS AND METHODS FOR FABRICATING SAME

(75) Inventor: Matthias Lehr, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 544 days.

(21) Appl. No.: 13/567,853

(22) Filed: Aug. 6, 2012

(65) Prior Publication Data

US 2014/0035099 A1 Feb. 6, 2014

(51) Int. Cl.
  *H01L 21/02* (2006.01)
  *H01L 21/8242* (2006.01)
  *H01L 49/02* (2006.01)
  *H01L 23/522* (2006.01)

(52) U.S. Cl.
  CPC .......... *H01L 28/75* (2013.01); *H01L 23/5223* (2013.01); *H01L 2924/0002* (2013.01)

(58) Field of Classification Search
  CPC ..... H01L 21/31; H01L 21/44; H01L 21/302; H01L 21/469
  USPC ....... 257/532, 368, 632, 737–738, 288, 773, 257/326, 584, 300–310; 438/240, 250, 253, 438/256
  See application file for complete search history.

(56) References Cited

U.S. PATENT DOCUMENTS

| | | | |
|---|---|---|---|
| 6,541,375 B1* | 4/2003 | Hayashi | C23C 14/08 257/E21.009 |
| 2003/0189255 A1* | 10/2003 | Sugiura et al. | 257/774 |
| 2004/0016946 A1* | 1/2004 | Oashi | 257/296 |
| 2004/0232463 A1* | 11/2004 | Chung | H01L 28/91 257/296 |
| 2007/0026625 A1* | 2/2007 | Chung | H01L 21/02178 438/396 |
| 2008/0191261 A1* | 8/2008 | Moon et al. | 257/314 |
| 2009/0315028 A1* | 12/2009 | Yaegashi et al. | 257/48 |
| 2010/0117194 A1* | 5/2010 | Chung et al. | 257/532 |
| 2010/0224921 A1* | 9/2010 | Wang | H01L 21/32051 257/295 |
| 2012/0057270 A1* | 3/2012 | Foerster | 361/311 |

* cited by examiner

*Primary Examiner* — Robert Bachner
*Assistant Examiner* — Moin Rahman
(74) *Attorney, Agent, or Firm* — Lorenz & Kopf, LLP

(57) ABSTRACT

Integrated circuits with metal-insulator-metal (MIM) capacitors and methods for fabricating such integrated circuits are provided. In an embodiment, an integrated circuit includes a dielectric material layer overlying a semiconductor substrate. A surface conditioning layer overlies the dielectric material layer. Further, a metal layer is formed directly on the surface conditioning layer. A MIM capacitor is positioned on the metal layer. The MIM capacitor includes a first conductive layer formed directly on the metal layer with a smooth upper surface, an insulator layer formed directly on the smooth upper surface of the first conductive layer, and a second conductive layer formed directly on the insulator layer with a smooth lower surface.

20 Claims, 3 Drawing Sheets

INTEGRATED CIRCUITS WITH METAL-INSULATOR-METAL (MIM) CAPACITORS AND METHODS FOR FABRICATING SAME

TECHNICAL FIELD

The present disclosure generally relates to integrated circuit and methods for fabricating integrated circuits, and more particularly relates to integrated circuits with metal-insulator-metal (MIM) capacitors and methods for fabricating integrated circuits with MIM capacitors.

BACKGROUND

Metal-insulator-metal (MIM) capacitors are valuable components in memory, logic and analog circuits. For example, MIM capacitors are critical in several mixed signal integrated circuits such as analog frequency tuning circuits, switched capacitor circuits, filters, resonators, up-conversion and down-conversion mixers, and A/D converters.

A typical MIM capacitor includes a first conductive layer, an insulating layer formed over the first conductive layer, and a second conductive layer formed over the insulating layer. As constructed, a MIM capacitor can store an electrical charge, with the charge per applied voltage (capacitance) of the capacitor dependent on the dielectric constant of the insulating layer, the thickness of the insulating layer (i.e., distance between the faces of the conductive layers), and the area of the conductive layers. The reliability of a MIM capacitor is affected by the smoothness of the faces of the MIM capacitor's conductive layers. Specifically, a MIM capacitor having layers with smooth conductive faces, i.e., reduced topography effects such as peaks and valleys, exhibits a reduced risk of shorts or leakages through the insulating layer therebetween.

Accordingly, it is desirable to provide integrated circuits with improved MIM capacitor reliability and methods for fabricating integrated circuits with improved MIM capacitor reliability. In addition, it is desirable to provide integrated circuits and methods for fabricating integrated circuits which form MIM layers with substantially smooth planar surfaces. Furthermore, other desirable features and characteristics will become apparent from the subsequent detailed description and the appended claims, taken in conjunction with the accompanying drawings and the foregoing technical field and background.

BRIEF SUMMARY

Integrated circuits with metal-insulator-metal (MIM) capacitors and methods for fabricating integrated circuits with MIM capacitors are provided. In accordance with one embodiment, an integrated circuit includes a dielectric material layer overlying a semiconductor substrate. A surface conditioning layer overlies the dielectric material layer. Further, a metal layer is formed directly on the surface conditioning layer. A MIM capacitor is positioned on the metal layer. The MIM capacitor includes a first conductive layer formed directly on the metal layer with a smooth upper surface, an insulator layer formed directly on the smooth upper surface of the first conductive layer, and a second conductive layer formed directly on the insulator layer with a smooth lower surface.

In another embodiment, an integrated circuit includes a dielectric material layer overlying a semiconductor substrate. A surface conditioning layer overlies the dielectric material layer, has a thickness of about 10 nanometers (nm) to about 50 nm, and has a smooth upper surface. The integrated circuit includes an aluminum layer with a thickness of about 20 nm to about 150 nm formed directly on the upper surface of the surface conditioning layer. The aluminum layer also has a smooth upper surface. Further, the integrated circuit includes a MIM capacitor formed directly on the smooth upper surface of the aluminum layer.

In accordance with another embodiment, a method for fabricating an integrated circuit with a MIM capacitor includes depositing a dielectric material layer overlying a semiconductor substrate. A surface conditioning layer is formed overlying the dielectric material layer. A metal layer is formed directly on the surface conditioning layer. The method includes forming a first MIM conductive layer on the metal layer, wherein the first MIM conductive layer has a smooth upper surface. The method forms a MIM insulator layer on the first MIM conductive layer and a second MIM conductive layer on the MIM insulator layer, wherein the second MIM conductor has a smooth lower surface.

BRIEF DESCRIPTION OF THE DRAWINGS

Embodiments of integrated circuits with MIM capacitors and methods for fabricating integrated circuits with MIM capacitors will hereinafter be described in conjunction with the following drawing figures, wherein like numerals denote like elements, and wherein.

DETAILED DESCRIPTION

The following detailed description is merely exemplary in nature and is not intended to limit the integrated circuits or methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits with metal-insulator-metal (MIM) capacitors and methods for fabricating integrated circuits with MIM capacitors are provided. As disclosed herein, problems with conventionally formed MIM capacitors may be reduced. Specifically, conventional techniques can result in MIM capacitor layers having surfaces with topographical irregularities or defects. For example, a conventional process may form a first MIM conductive layer over a metal layer, a MIM insulator layer over the first MIM conductive layer, and a second MIM conductive layer over the MIM insulator layer. Surface irregularities and/or roughness in the metal layer are repeated in the overlying first MIM conductive layer, MIM insulator layer, and second MIM conductive layer. As a result, the surfaces of the MIM conductive layers are irregular and the risk of shorts or leakages through the MIM insulator layer increases.

In order to reduce surface irregularities and to form smooth surfaces in the MIM layers, the integrated circuit and method for fabrication disclosed herein provide for a surface conditioning layer below the metal layer on which the MIM capacitor layers are formed. The surface conditioning layer exhibits a homogeneous smooth upper surface and promotes smooth uniform growth of the metal layer. As a result, the metal layer is provided with a smooth upper surface on which the MIM capacitor layers may be formed. Smooth upper (and lower) surfaces are repeatedly formed by each successive layer deposited over the smooth upper surface of the metal layer. Therefore, topographical defects are not introduced to and are not repeated by the MIM capacitor layers, the MIM capacitor layers are smooth, and the risk of shorts or leakages through the MIM insulator layer is reduced.

FIGS. 1-6 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
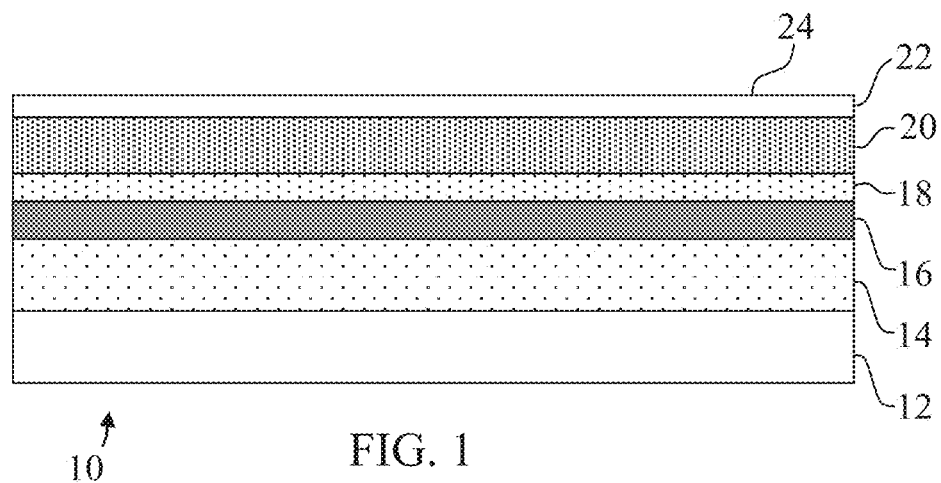
FIGS. 1-6 illustrate, in cross section, a portion of an integrated circuit and method steps for fabricating an integrated circuit in accordance with various embodiments herein.

In FIG. 1, in an exemplary embodiment, the process of fabricating an integrated circuit 10 begins by providing a semiconductor substrate 12. Semiconductor devices are formed in and/or on the semiconductor substrate 12 during typical front-end-of-line (FEOL) processing. Also, back-end-of-line (BEOL) processing may be performed to form contacts, insulating layers, metal layers, and bonding sites on semiconductor substrate 12. In FIG. 1, an interlayer dielectric material 14 is deposited over the semiconductor substrate 12. As is well-known, a metal interconnect layer 16 is deposited over the interlayer dielectric material 14 and is planarized. Typically, the metal interconnect layer 16 is copper, though other metals may be used for selected characteristics. After the metal interconnect layer 16 is planarized, in an exemplary embodiment, dielectric layers 18, 20, such as a silicon nitride layer 18 and a silicon oxide layer 20, are deposited over the partially fabricated integrated circuit 10. Either of these layers 18, 20 may be optional.

As shown in FIG. 1, the present fabrication method provides for depositing a surface conditioning layer 22 over the dielectric layer 20. An exemplary surface conditioning layer 22 is about 10 nm to about 50 nm thick, such as about 20 nm thick. An exemplary surface conditioning layer 22 is substantially formed with a single crystal orientation, i.e., over 50% of the surface conditioning layer 22 has the same crystal orientation. For example, in an exemplary embodiment, over 50% of the surface conditioning layer 22 has a 1-1-1 crystal orientation. An exemplary surface conditioning layer 22 is titanium, titanium nitride, tantalum, or tantalum nitride, and is deposited by chemical vapor deposition. In other embodiments, the surface conditioning layer 22 may be formed by another crystalline material. The surface conditioning layer 22 is formed with a smooth upper surface 24. As used herein, a "smooth" surface exhibits a total topographical range, or height differential, of about 2 nm to less than about 8 nm, i.e., the height difference between the surface's deepest valley and the surface's highest peak is about 2 nm to less than about 8 nm.

In order to provide the surface conditioning layer 22 with a smooth surface and with the desired crystal orientation, the layer 22 is deposited by physical vapor deposition (PVD) at a controlled temperature regime. The temperature regime and PVD process is dependent on the material used for forming the layer 22, the desired crystal orientation, and the desired homogeneity of the material with respect to the crystal orientation.

Figure 2:
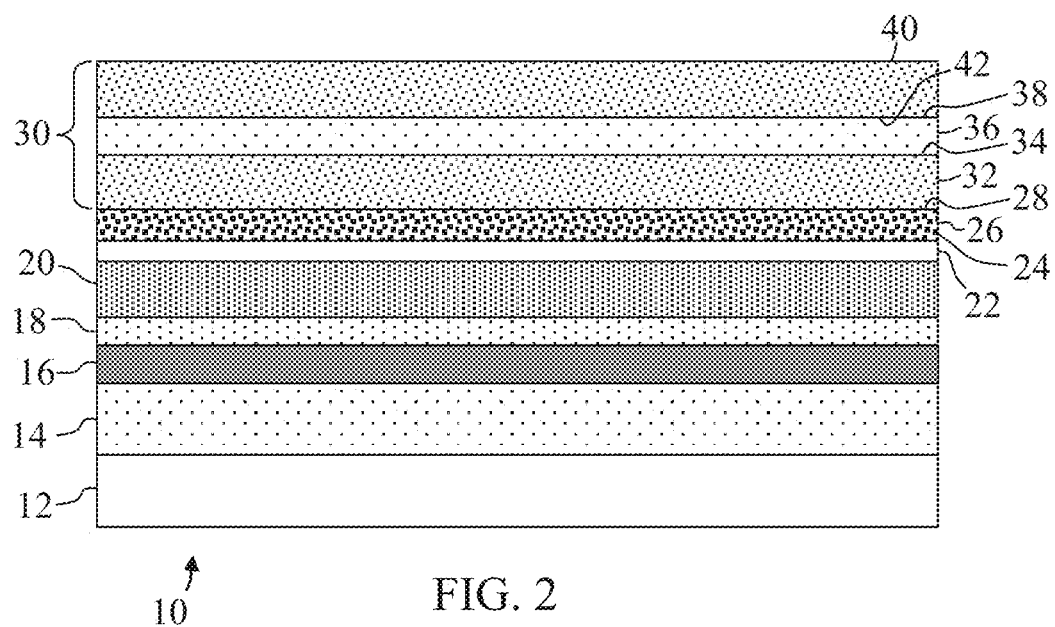

In FIG. 2, a metal layer 26 is deposited over the upper surface 24 of the surface conditioning layer 22. An exemplary metal layer 26 is about 20 nm to about 150 nm thick, such as about 40 nm thick. In an exemplary embodiment, the metal layer 26 is aluminum and is deposited by physical vapor deposition. The metal layer 26 is formed with a smooth upper surface 28 due to its formation on smooth surface 24. In other words, the metal layer 26 exhibits a total topographical range of about 2 nm to less than about 8 nm. Conventionally formed metal layers are typically rough, having a topographical range of over 8 nm, such as about 25 nm. After deposition of the metal layer 26, the MIM capacitor structure 30 is formed. Specifically, a first MIM conductive layer 32 is deposited directly onto the upper surface 28 of the metal layer 26. The inclusion of the metal layer 26 below the first MIM conductive layer 32 provides for reduced resistance at the first MIM conductive layer 32. Conductive layers appropriate for use in a MIM capacitor are well known, but an exemplary MIM conductive layer 32 is titanium nitride (TiN). An exemplary MIM conductive layer 32 has a thickness of about 20 nm to about 50 nm, such as about 35 nm. First MIM conductive layer 32 is formed with a smooth upper surface 34 due to the layer's formation over smooth surface 28.

A MIM insulator layer 36 is deposited over the upper surface 34 of the first MIM conductive layer 32. Various dielectric materials may be selected for use as the MIM insulator layer 36. An exemplary MIM insulator layer 36 is tantalum oxide ($Ta_2O_5$). An exemplary MIM insulator layer 36 has a thickness of about 5 nm to about 20 nm, such as about 12 nm. The MIM insulator layer 36 is formed with a smooth upper surface 38 due to the layer's formation on smooth surface 34. As shown, a second MIM conductive layer 40 is deposited onto the upper surface 38 of the MIM insulator layer 36. In an exemplary embodiment, the second MIM conductive layer 40 is the same material as the first MIM conductive layer 32. An exemplary MIM conductive layer 40 has a thickness of about 30 nm to about 100 nm, such as about 55 nm. Further, the second MIM conductive layer 40 is formed with a smooth lower surface 42 due to its formation on smooth surface 38.

Thus, the facing conductive surfaces 34 and 42 of the MIM capacitor structure 30 are both smooth. The resulting MIM capacitor structure 30 exhibits reduced shortages or leakages through the MIM insulator layer 36. In an exemplary embodiment, each of surfaces 24, 28, 34, 38 and 42 exhibits a topographical range of less than about 8 nm. In another exemplary embodiment, each of surfaces 24, 28, 34, 38 and 42 exhibits a topographical range of about 2 nm, or each of surfaces 24, 28, 34, 38 and 42 exhibits a topographical range of less than about 2 nm.

Figure 3:
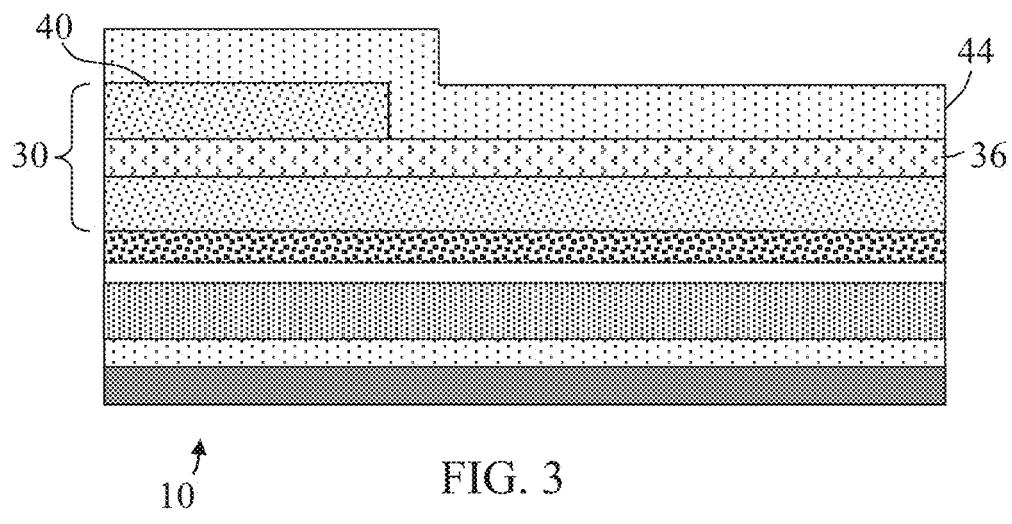
Figure 4:
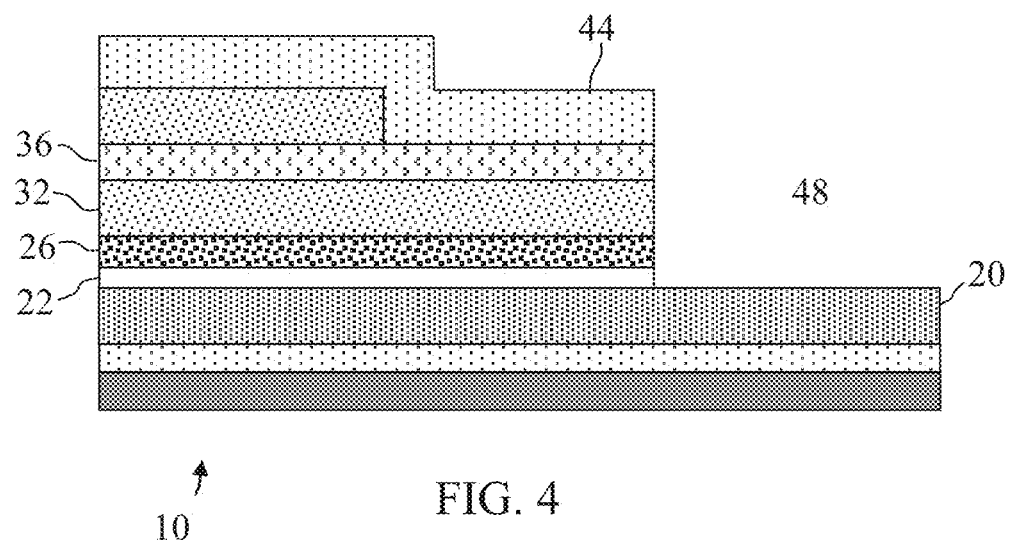
Figure 5:
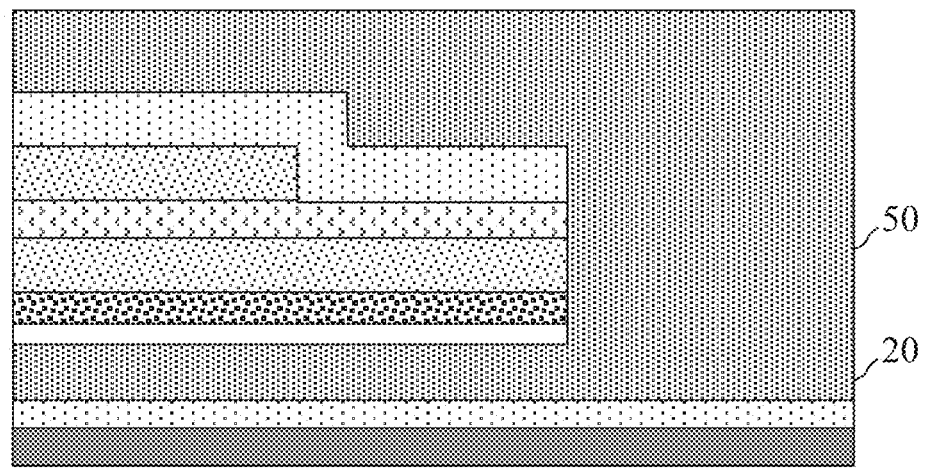

FIGS. 3-6 illustrate further processing to provide for electrical contact through the MIM capacitor structure 30. It is noted that layers 12 and 14 are not shown in FIGS. 3-6 simply for purposes of economy. In FIG. 3, the second MIM conductive layer 40 is etched through a typical lithographic process. Then, a dielectric layer 44, such as silicon nitride, is deposited over the partially fabricated integrated circuit 10. As shown, the dielectric layer 44 contacts the second MIM conductive layer 40 and the MIM insulator layer 36. FIG. 4 illustrates the partially fabricated integrated circuit 10 after further etching down to the dielectric layer 20. Specifically, layers 44, 36, 32, 26, and 22 are etched to form a trench 48. In FIG. 5, additional dielectric material 50 is deposited over the partially fabricated integrated circuit 10 and fills the trench 48. The additional dielectric material 50 may be the same material as the dielectric layer 20, and may be considered to merge with dielectric layer 20. An exemplary dielectric material 50 is silicon oxide.

Figure 6:
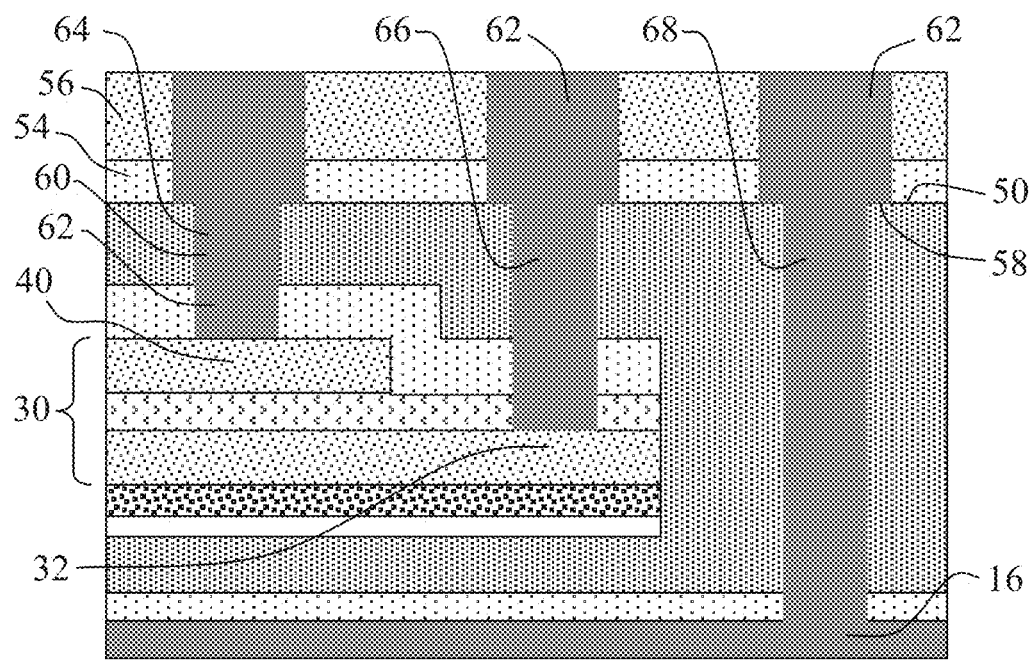

In FIG. 6, additional dielectric layers 54 and 56 have been deposited over the dielectric material 50. For example, dielectric layer 54 may be nitride and dielectric layer 56 may be oxide. As shown, via portions 58 have been etched to a first depth through layers 54 and 56 to contact the oxide material 50, and via portions 60 have been etched deeper to selected depths. The via portions 58 and 60 are filled with a conductive material 62, such as copper, to form electrical contacts. As shown, a first via 64 extends to and forms an electrical contact with the second MIM conductive layer 40. A second via 66 extends to and forms an electrical contact with the first MIM conductive layer 32. Also, a third via 68 extends to and forms an electrical contact with metal interconnect layer 16. The via portions 60 may be etched and filled with conductive material 62 before depositing layers 54 and 56, etching layers 54 and 56 to form via portions 58, and filling via portions 58 with conductive material 62 to form the vias 64, 66, and 68.

While the integrated circuit 10 includes three illustrated electrical connections, it is understood that the MIM capacitor structure 30 may be realized with various electrical connections through selected lithography and deposition techniques. Further back-end-of-line (BEOL) processing may be performed to prepare the integrated circuit 10 for its desired use.

As described above, an integrated circuit is fabricated with a MIM capacitor having improved reliability. Conventional processes result in MIM capacitor layers with irregular or non-smooth surfaces and corresponding increases in shorts and leakages. These issues are avoided by incorporating a surface conditioning layer below the metal layer on which the MIM capacitor layers are formed. As a result, the MIM capacitor layers, including the MIM conductive layers and the MIM insulator layer, exhibit improved smoothness and fewer topographical defects, and result in improved capacitor reliability with fewer shorts and leakages.

To briefly summarize, the integrated circuits and fabrication methods described herein result in improved MIM capacitor reliability. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
a dielectric material layer overlying a semiconductor substrate;
a surface conditioning layer overlying the dielectric material layer, wherein the surface conditioning layer has an upper surface with a total topographical range or height differential of less than about 8 nm;
a metal directly on the surface conditioning layer, wherein the metal has an upper surface with a total topographical range or height differential of less than about 8 nm; and
a metal-insulator-metal (MIM) capacitor directly on the upper surface of the metal, wherein the MIM capacitor comprises a first conductive layer directly on the upper surface of the metal, an insulator layer directly on the upper surface of the first conductive layer, and a second conductive layer directly on the insulator layer.

2. The integrated circuit of claim 1 further comprising a planarized metal layer between the semiconductor substrate and the dielectric material layer, wherein the planarized metal layer separates all portions of the semiconductor substrate from the dielectric material.

3. The integrated circuit of claim 2 further comprising a silicon nitride layer directly on the planarized metal layer, wherein the dielectric material layer is directly on the silicon nitride layer, wherein the dielectric material layer is silicon oxide, and wherein the surface conditioning layer is directly on the dielectric material layer.

4. The integrated circuit of claim 3 further comprising:
silicon nitride directly on the MIM capacitor; and
a metal contact passing through the silicon nitride and in contact with the second conductive layer of the MIM capacitor.

5. The integrated circuit of claim 3 wherein the surface conditioning layer is substantially formed with a 1-1-1 crystal orientation.

6. The integrated circuit of claim 1 wherein the metal directly on the surface conditioning layer is aluminum.

7. The integrated circuit of claim 6 wherein the surface conditioning layer is selected from titanium, titanium nitride, tantalum, and tantalum nitride.

8. The integrated circuit of claim 1 wherein the first conductive layer has a surface topographical range to layer thickness ratio of less than about 8/35, and the second conductive layer has a surface topographical range to layer thickness ratio of less than about 8/55 .

9. The integrated circuit of claim 1 wherein the surface conditioning layer has a thickness of about 20 nm and has an upper surface with a total topographical range or height differential of less than about 2 nm.

10. The integrated circuit of claim 1 wherein the metal has a thickness of from about 20 nm to about 150 nm.

11. The integrated circuit of claim 10 wherein the metal has a thickness of about 40 nm.

12. An integrated circuit comprising:
a dielectric material layer overlying a semiconductor substrate;
a surface conditioning layer overlying the dielectric material layer, having a thickness of about 10 nm to about 50 nm, and having an upper surface having a total topographical range or height differential of less than about 2 nm;
aluminum having a thickness of about 20 nm to about 150 nm directly on the upper surface of the surface conditioning layer and having an upper surface having a total topographical range or height differential of less than about 2 nm; and
a metal-insulator-metal (MIM) capacitor directly on the upper surface of the aluminum.

13. The integrated circuit of claim 12 further comprising:
a planarized copper layer between the semiconductor substrate and the dielectric material layer; and
a silicon nitride layer directly on the planarized copper layer, wherein the dielectric material layer is an oxide layer directly on the nitride layer, wherein the surface conditioning layer is directly on the dielectric material layer.

14. The integrated circuit of claim 12 wherein the surface conditioning layer is substantially formed with a single crystal orientation.

15. The integrated circuit of claim 12 wherein the surface conditioning layer is titanium, titanium nitride, tantalum, or tantalum nitride.

16. A method for fabricating an integrated circuit with a metal-insulator-metal (MIM) capacitor comprising:
- depositing a dielectric material layer overlying a semiconductor substrate;
- forming a surface conditioning layer overlying the dielectric material layer by depositing tantalum directly on the dielectric material layer;
- depositing a metal directly on the surface conditioning layer using a pressure vapor deposition (PVD) process;
- forming a first MIM conductive layer directly on the metal;
- forming a MIM insulator layer directly on the first MIM conductive layer; and
- forming a second MIM conductive layer directly on the MIM insulator layer.

17. The method of claim 16 wherein depositing a metal directly on the surface conditioning layer using a pressure vapor deposition (PVD) process comprises depositing aluminum directly on the surface conditioning layer using the pressure vapor deposition (PVD) process.

18. The method of claim 16 wherein forming the surface conditioning layer overlying the dielectric material layer comprises depositing tantalum directly on the dielectric material layer by pressure vapor deposition (PVD).

19. The method of claim 16 wherein forming the surface conditioning layer overlying the dielectric material layer comprises depositing tantalum directly on the dielectric material layer by chemical vapor deposition (CVD).

20. The method of claim 16 wherein the surface conditioning material is formed with an initial surface smoothness, and wherein depositing the metal directly on the surface conditioning layer comprises depositing the metal directly on the surface conditioning layer comprises depositing the metal directly on the surface conditioning layer without changing the initial surface smoothness of the surface conditioning layer.

* * * * *